United States Patent
Outsuka

(10) Patent No.: US 6,714,691 B2
(45) Date of Patent: *Mar. 30, 2004

(54) EXPOSURE METHOD AND APPARATUS, AND DEVICE MANUFACTURING METHOD USING THE SAME

(75) Inventor: Kazuhito Outsuka, Tokyo (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 73 days.

(21) Appl. No.: 09/328,797

(22) Filed: Jun. 9, 1999

(65) Prior Publication Data

US 2003/0048960 A1 Mar. 13, 2003

(30) Foreign Application Priority Data

Jun. 12, 1998 (JP) ............................................. 10-181698

(51) Int. Cl.⁷ .............................. G06K 9/32; G01B 9/02
(52) U.S. Cl. ........................ 382/294; 382/144; 356/490
(58) Field of Search ................................ 382/294, 295, 382/296, 141, 144, 151, 147; 355/53; 359/754; 356/401, 450, 490

(56) References Cited

U.S. PATENT DOCUMENTS

| | | | | |
|---|---|---|---|---|
| 4,780,615 A | * | 10/1988 | Suzuki ........................ 250/548 |
| 5,151,749 A | * | 9/1992 | Tanimoto et al. ............ 356/620 |
| 5,231,471 A | * | 7/1993 | Torigoe ........................ 356/401 |
| 5,323,207 A | * | 6/1994 | Ina ............................... 355/53 |
| 5,568,257 A | * | 10/1996 | Ota et al. ..................... 356/490 |
| 5,572,288 A | * | 11/1996 | Mizutani ....................... 355/53 |
| 5,751,404 A | * | 5/1998 | Murakami et al. ............. 355/53 |
| 5,812,271 A | * | 9/1998 | Kim ............................. 356/401 |
| 5,894,056 A | | 4/1999 | Kakizaki et al. ................ 430/5 |
| 5,917,580 A | * | 6/1999 | Ebinuma et al. ............... 355/53 |
| 5,925,887 A | | 7/1999 | Sakai et al. |
| 5,978,071 A | * | 11/1999 | Miyajima et al. .............. 355/53 |
| 5,995,199 A | * | 11/1999 | Shinozaki et al. ............. 355/53 |
| 6,040,096 A | | 3/2000 | Kakizaki et al. ................ 430/5 |
| 6,069,683 A | * | 5/2000 | Iwamoto ....................... 355/53 |
| 6,084,723 A | * | 7/2000 | Matsuzawa et al. ......... 359/754 |
| 6,141,108 A | | 10/2000 | Kida et al. .................... 356/401 |
| 6,490,025 B1 | * | 12/2002 | Makinouchi et al. .......... 355/53 |

FOREIGN PATENT DOCUMENTS

| | | |
|---|---|---|
| JP | 9-171246 | 6/1997 |
| JP | 10-41219 | 2/1998 |
| JP | 10-50604 | 2/1998 |
| NL | 1 011 888 | 3/2000 |

\* cited by examiner

*Primary Examiner*—Bhavesh M. Mehta
*Assistant Examiner*—Kanji Patel
(74) *Attorney, Agent, or Firm*—Fitzpatrick, Cella, Harper & Scinto

(57) ABSTRACT

An exposure apparatus for transferring a pattern of a first object onto a second object. The apparatus includes a holding member for holding the first object. The first object is positioned on the holding member and then is held thereon, and the first object as held by the holding member is then aligned with respect to the second object. A detecting device, provided on the holding member, directly detects in real time a relative positional deviation between the first object and the holding member. The detecting device detects the relative positional deviation after the first object is held by the holding member and before the holding member releases the holding of the first object.

21 Claims, 6 Drawing Sheets

EXPOSURE METHOD AND APPARATUS, AND DEVICE MANUFACTURING METHOD USING THE SAME

FIELD OF THE INVENTION AND RELATED ART

This invention relates to an exposure method and a device manufacturing method using the same. More particularly, the invention is concerned with an exposure apparatus or a projection exposure apparatus based on a proximity method, a step-and-repeat method or a step-and-scan method, for use in the production of various devices such as ICs, LSIs, CCDs, liquid crystal panels, or magnetic heads, for example, wherein a fine electronic circuit pattern formed on a reticle (first object) is lithographically transferred to a wafer (second object) after they are relatively aligned.

In projection exposure apparatuses for the manufacture of semiconductor devices, improvement of the precision of relative alignment between a reticle and a wafer is an important factor for enlargement of integration of the semiconductor device. Recently, an alignment precision higher than a submicron order is required to meet further miniaturization of semiconductor chips.

In reduction projection type exposure apparatuses for semiconductor device production, a circuit pattern of a reticle (first object) is projected and printed on a wafer (second object) through a projection lens system. Here, before the projection exposure, an observing system (detecting means) is used to observe the reticle surface or wafer surface to detect alignment marks of the reticle and/or the wafer. On the basis of the result of detection, positional registration (alignment) between the reticle and the wafer is made.

Due to further miniaturization of semiconductor chips, improvement of precision of the relative alignment between a reticle and a wafer has been desired.

In conventional exposure apparatuses, once a reticle is aligned with respect to a reference mark provided in a portion of the exposure apparatus (reticle alignment operation), the reticle is held fixed until the next alignment operation. For this reason, the position of the reticle is dependent upon the holding performance (holding precision) of a holding member (generally, a reticle stage) for holding the reticle.

Generally, the reticle alignment is performed in response to reticle replacement. When the same reticle is used, the frequency of an alignment operation differs in dependence upon the user. If, therefore, there occurs a variation in an environment, or vibration or acceleration in the apparatus, for example, due to the influence thereof, there may occur a change in relative position between the reticle and the holding member therefor. On that occasion, when the pattern of the reticle is projected and printed on a wafer, the exposure position may displace or a deviation may occur during the exposure process. This causes degradation of resolving power for the pattern image.

SUMMARY OF THE INVENTION

It is an object of the present invention to provide an exposure apparatus by which, the position of a reticle and/or a wafer can be corrected after relative alignment of the reticle and the wafer, particularly, after alignment (reticle alignment) of the reticle with respect to a reference mark provided in a portion of the major assembly of the exposure apparatus, and by which production of large integration semiconductor devices is facilitated.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
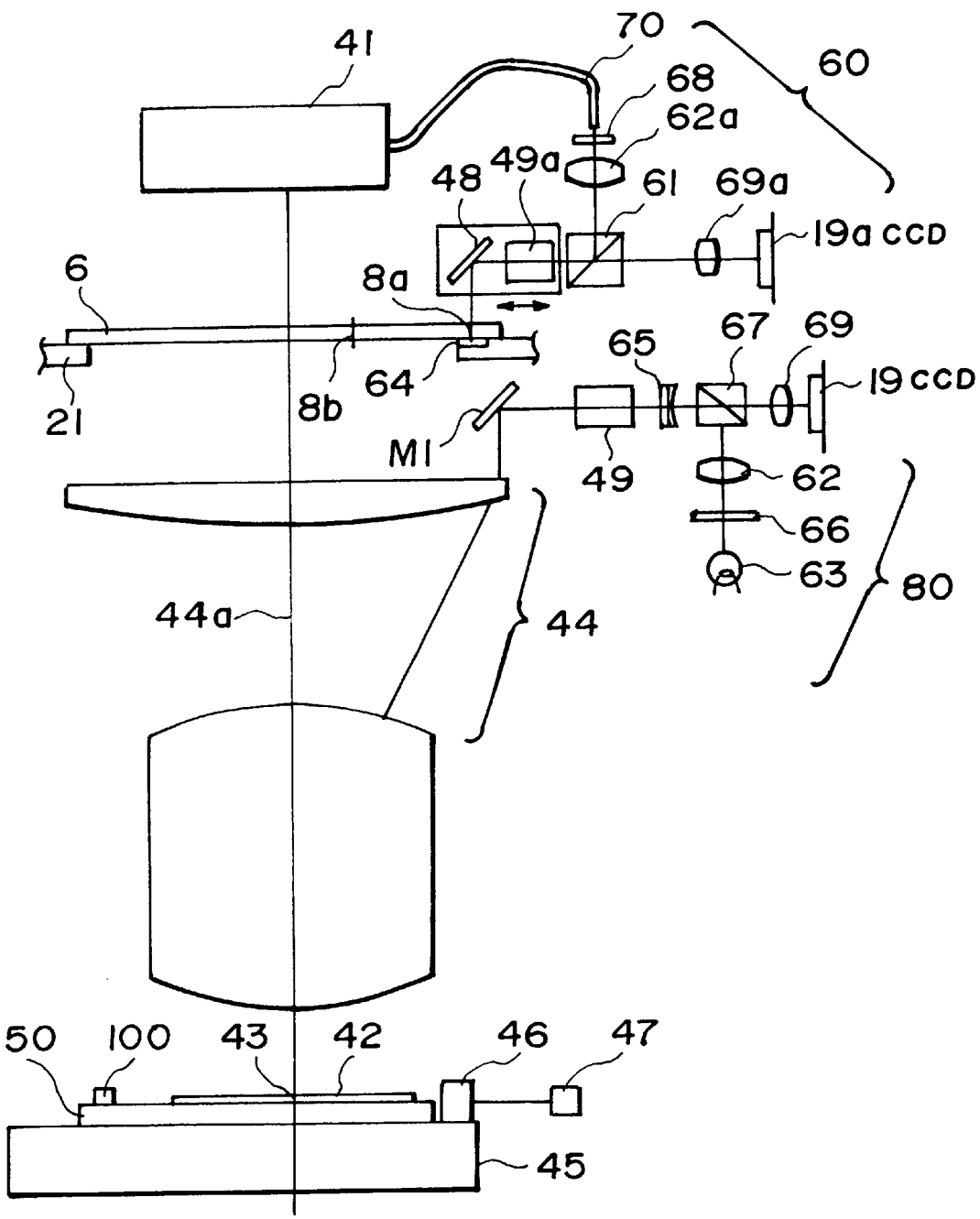
FIG. 1 is a schematic view of a main portion of an exposure apparatus according to an embodiment of the present invention.
Figure 2:
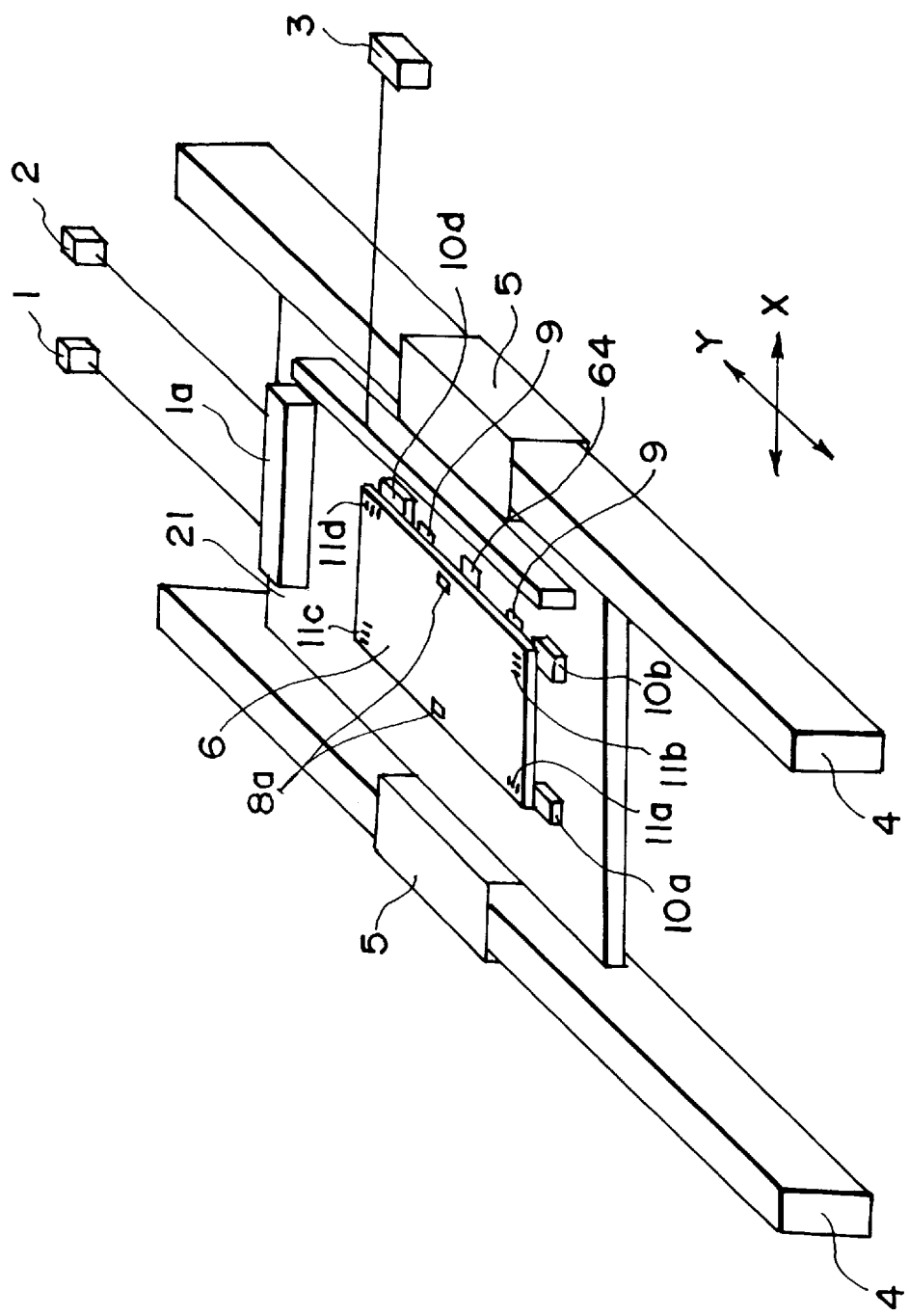
FIG. 2 is an enlarged view of a portion of FIG. 1.

FIG. 1 is a schematic view of a main portion of an exposure apparatus according to a first embodiment of the present invention. In this example, the invention is applied to a step-and-repeat or step-and-scan type projection exposure apparatus for the manufacture of semiconductor devices. FIG. 2 is a schematic view for explaining a portion around a reticle 6 in FIG. 1, particularly, in the case of a step-and-scan method.

In the embodiment, the apparatus is equipped with a structure and function that, if, after relative alignment between a reticle 6 and a wafer 42 is completed, there occurs relative displacement between the reticle 6 and a reticle holding device (reticle stage) 21 therefor as a result of any influence by a change in environment, or vibration or acceleration applied externally, the amount of such displacement is detected in real time by means of a linear encoder, and the position of the reticle and/or the wafer is corrected.

The method of relative alignment between the reticle 6 and the wafer 42 will be described first. The relative alignment between the reticle 6 and the wafer 42 may be done in accordance with a known method, such as disclosed in Japanese Laid-Open Patent Application, Laid-Open No. 41219/1998.

The alignment method will be described in detail.

In FIG. 1, denoted at 6 is a reticle (first object) which is placed on a reticle stage 21. The reticle 6 can be illuminated with exposure light from illumination means 41. Denoted at 8a and 8b are a reticle alignment mark formed on the reticle 6 surface and another alignment mark to be used for baseline measurement. Denoted at 42 is a wafer (second object) having a wafer alignment mark 43 formed on its surface. Denoted at 44 is a projection optical system having a projection lens system, for projecting a circuit pattern, for example, formed on the reticle 6 surface onto the wafer 42 surface.

Denoted at 50 is a θ-Z stage on which the wafer 42 is placed. It serves to perform θ rotation of the wafer 42 as well as focus adjustment (adjustment in the Z direction) of the wafer. Provided on the θ-Z stage 50 is a stage reference mark 100 which is made by a Si substrate machined into a predetermined shape. The θ-Z stage 50 is mounted on an X-Y stage 45 for performing high precision stepwise motion. Mounted on the X-Y stage 45 is an optical square 46 which functions to provide a reference for the stage position measurement. This optical square is monitored by a laser interferometer 47. This optical square is monitored by a laser interferometer 47. The θ-Z stage 50 and the X-Y stage 45 are components of driving means.

The alignment procedure for the reticle 6 and the wafer 42 in this embodiment is performed indirectly, through an alignment process using a mark provided in a TTL microscope 80, to be described later.

First, the method of alignment for a mark (reticle alignment mark) 8a provided on the reticle 6 and a reference mark (reticle reference mark) 64 provided on the reticle stage 21, which is a portion of the major assembly, will be described.

In this embodiment, any relative deviation between the reference mark 64 and the reticle alignment mark 8a is detected by using a TTR (Through-The-Reticle) microscope 60 and, then, they are brought into alignment with each other. Although in FIG. 1 there is only one TTR microscope 60 illustrated, another microscope is provided on the left-hand side of the optical axis 44a of the projection optical system 44. By using plural microscopes, rotation of the reticle 6 can be detected and, thus, further improvement of alignment precision is attainable. The alignment of the reticle 6 and the reference mark 64 is performed in the following manner.

The TTR microscope 60 includes a combination of a mirror 48 and an objective lens 49a, and a mechanism (not shown) for moving them along a plane parallel to the reticle 6. To this end, the system from the objective lens 49a to a relay lens 69a is an afocal system. Prior to detection of the reference mark 64, the mirror 48 and the objective lens 49a are moved to the position for alignment of the reticle 6.

Light from an exposure light source 41 goes through a light guide 70, and it is directed to the TTR microscope 60. By means of a wavelength selecting filter 68, only a wavelength corresponding to the exposure light, in this example, is selected and directed into the TTR microscope 60.

By means of the wavelength selecting filter 68, only light of a predetermined wavelength width is allowed to pass, and the light is collected by a condenser lens 62a and then it is reflected by a beam splitter 61. The light reflected by the beam splitter 61 goes via the objective lens 49a and the mirror 48, with which the reticle alignment mark 8a and the reference mark 64 are illuminated. The reticle alignment mark 8a of the reticle 6 and the reference mark 64 are set to be disposed with a spacing not greater than the depth of focus of the objective lens 49a. The light reflected by the reticle alignment mark 8a and the reference mark 64 goes back along its on-coming path, via the mirror 48 and the objective lens 49a, in this order, and after passing the beam splitter 61, it is projected on a CCD 19a surface. Thus, mark images of these marks are formed thereon. With this arrangement, when both the reticle alignment mark 8a and the reference mark 64 are placed within the observation region of the objective lens 49a, both of these marks can be observed simultaneously.

A video signal as provided by photoelectric conversion through the CCD camera 19a is transmitted to an image processing device (not shown), whereby relative deviation between the reticle alignment mark 8a and the reference mark 64 is calculated. On the basis of the thus produced information, the reticle stage 21 is moved to bring the reticle 6 into alignment with the major assembly of the exposure apparatus.

Next, the alignment of a wafer 42 is performed by detecting a wafer alignment mark (mark) 43 provided on the wafer 42, by using a TTL (Through-The-Lens) microscope 80.

Now, the method of detecting the position of the wafer alignment mark 43 on the wafer 42 will be described. Denoted at 63 is a light source (light source means) which comprises a white light source such as a halogen lamp, for example. Wavelength selecting filter 66 functions to pass therethrough only light of a predetermined wavelength width (for example, a wavelength of 633±20 nm and a half width of 40 nm), different from the exposure light, out of the light from the light source 63. The light goes through a condenser lens (illumination optical system) 62 and impinges on a polarization beam splitter 67 by which rectilinearly polarized light having a plane of polarization in a predetermined direction is reflected.

The light reflected by the polarization beam splitter 67 is then transformed by a quarter waveplate 65 into circularly polarized light which then goes through a correcting lens 49, for correction of spherical aberration or chromatic aberration. Then, the light is reflected by a mirror M1 and enters the projection lens system 44. The light received by the projection lens system 44 is emitted thereby, to illuminate the wafer alignment mark 43 upon the wafer 42 surface.

Light reflected by the mark 43 on the wafer 42 surface goes back along its on-coming path, via the projection lens system 44, the mirror M1 and the correcting optical system 49 in this order, and it enters the quarter waveplate 65. The light passing this quarter waveplate 65 has been transformed into rectilinearly polarized light having its plane of polarization rotated by 90 deg. as compared with the light before the transformation. Now, the light goes through the polarization beam splitter 67 and, through a relay lens 69, it is projected on a CCD (image pickup device) 19. Thus, an image (mark image) of the wafer alignment mark 43 is formed thereon.

The position of the mark image thus formed on the CCD 19 surface is observed (measured) by using image processing means (not shown), by which the positional relation of the wafer 42 can be detected. Here, for example, a deviation of the mark image from a reference position (reference mark) defined on the CCD 19 surface may be detected. More specifically, the TTL microscope 80 is used to perform the wafer alignment, in the following manner.

After completion of prealignment, the X-Y stage 45 is moved to place a mark 43, of a shot, with respect to which the alignment is to be performed first, below the TTL microscope 80. Here, the driving coordinates for the X-Y stage 45 may be the coordinates which are set as a default, or it may be the coordinates as calculated by a preceding alignment measurement operation. The position of the mark 43 being observed through the TTL microscope 80 is calculated. After performing measurement to one shot with respect to two directions of X and Y the X-Y stage 45 is moved toward the second alignment measurement shot position.

In this manner, alignment measurement is performed to the shots of a number being preset, and a driving grid for X-Y stage 45 in an exposure operation is calculated. The X-Y stage 45 is then moved in accordance with the grid, and exposures of the wafer 42 are performed. Preferably, the sampling of alignment shots within the wafer 42 may be made substantially concentric.

Although in this embodiment the procedure has been described with reference to a global alignment method, any other alignment method may by used.

The alignment method has been described above and, since it is based on an off-axis alignment method, baseline correction is necessary. To this end, baseline measurement is performed. This measurement uses a stage reference mark 100 which is provided on the X-Y Stage 45.

In the embodiment of FIG. 1, although the alignment procedure has been described with reference to a TTL off-axis alignment method using the projection optical system, the present invention is not limited to it. For example, a TTL on-axis alignment method or a Non-TTL off-axis alignment method may be used similarly.

Next, referring to FIG. 2, a mechanism for detecting relative displacement between the reticle 6 and the reticle stage 21, which may occur after completion of alignment between the reticle 6 and the wafer 46, will be explained.

FIG. 2 is a schematic view for explaining detection of positional deviation of a reticle 6, placed on a reticle stage 21, by using a pattern (reticle mark) provided on the reticle 6.

Denoted in the drawing at 1, 2 and 3 are laser interferometers for measurement of the position of the reticle stage 21. The laser interferometer 1 functions for measuring a position Y1, and the laser interferometer 2 functions for measuring a position Y2. The Y position measurement to the reticle stage 21 is made on the basis of the position Y1 and the position Y2, or of an average of the positions Y1 and Y2. Displacement of $\theta$ is measured on the basis of a difference between positions Y1 and Y2. The laser interferometer 3 functions for position measurement with respect to the X direction.

Denoted at 4 and 5 are stators and movable elements, constituting a linear motor mechanism for X, Y and $\theta$ drive of the reticle stage 21. The reticle stage 21 can be moved in the Y direction, by means of the linear motor mechanism (4, 5). This enables scanning exposure. Denoted at 6 is a reticle, and denoted at 8a is a reticle mark (reticle alignment mark) for the reticle alignment. Denoted at 64 is a reticle reference mark which is provided on the reticle stage 21, for the reticle alignment. Denoted at 9 are reticle attracting pads for fixedly holding the reticle 6 on the reticle stage 21.

Denoted at 10 (10a, 10b, 10c, 10d) is detecting means which constitutes a portion of linear encoder means for detecting relative displacement between the reticle 6 and the reticle stage 21. It is provided on the reticle stage 21. Denoted at 11 (11a, 11b, 11c, 11d) are linear encoder patterns, constituting a portion of the linear encoder for detecting relative displacement of the reticle 6 and the reticle stage 21, which are provided on the reticle side.

Characters a, b, c and d denote linear encoder means (detecting means) each comprising a detecting device 10, a pattern 11 and a pattern 32, in this example. They are disposed at four corners of the reticle 6, in this embodiment.

Figure 3:
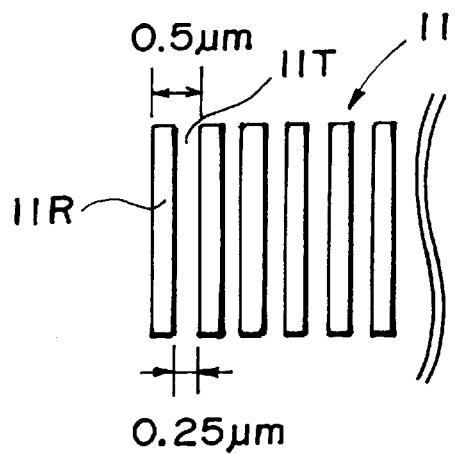
FIG. 3 is a schematic view for explaining the pattern in a portion of detecting means in FIG. 2.

FIG. 3 shows a portion of the pattern 11 for the linear encoder, which is provided on the reticle 6. The pattern 11 comprises a rectangular pattern having a reflective portion 11R and non-reflective portion 11T, having linewidth of 0.25 micron.

In FIG. 2, the reticle 6 is conveyed onto the reticle stage 21 by reticle conveying means (not shown). The reticle 6 is then set or aligned by a reticle alignment system (not shown) and reticle alignment driving means (not shown) so that the deviation between the reticle alignment mark 8a and the reticle reference mark 64 is minimized. Then, the reticle is held fixed on the reticle stage 21 by means of the reticle attracting pads 9. After the fixation, a deviation is measured by using the reticle alignment system (not shown). The thus measured value is used as an offset in position correction.

Here, the value of a pulse counter which is a constituent element of the linear encoder (not shown), is initialized. If, thereafter, relative displacement occurs between the reticle 6 and the reticle stage 21, the amount of relative displacement is detected in real time by the linear encoder means a, b, c and d, and a corresponding signal is outputted. On the basis of a signal from the detecting means, the position of the reticle 6 and/or of the wafer 42 is corrected by using the correcting means, whereby accurate projection exposure is assured.

Figure 4:
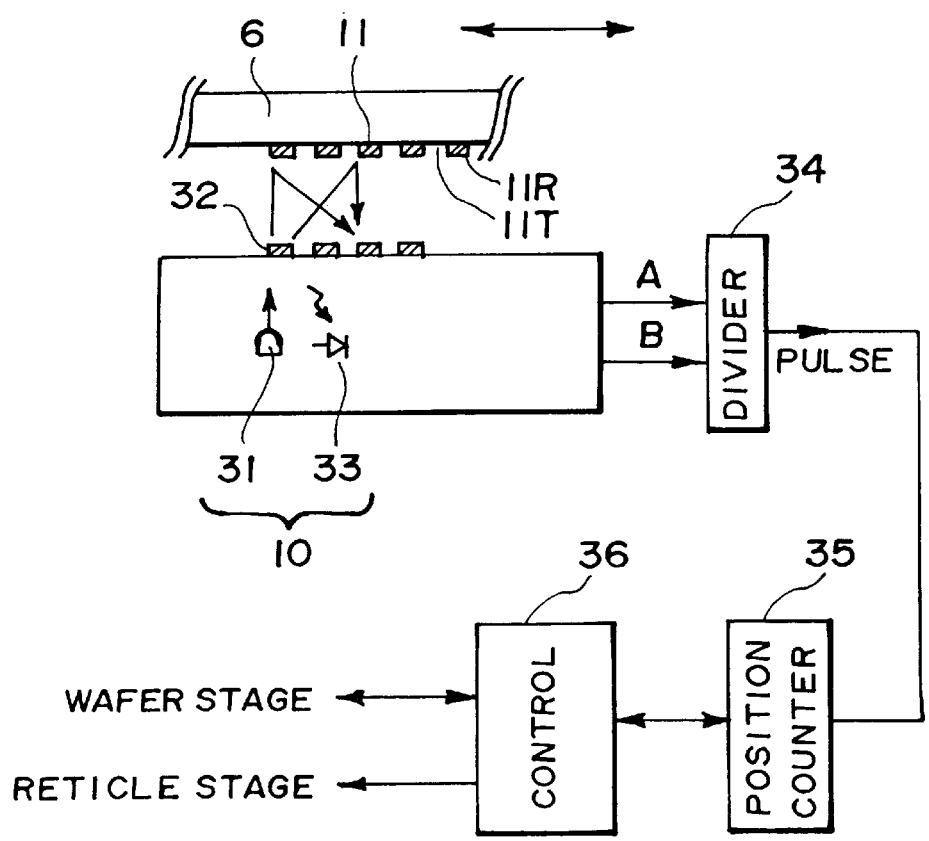
FIG. 4 is a schematic and diagrammatic view of a portion of FIG. 2.

FIG. 4 is a schematic view of a main portion of the linear encoder means of FIG. 2. It is to be noted here that the linear encoder means may be based on one of known measurement methods.

In FIG. 4, light divergently emitted from a light emitting device 31 disposed inside the detecting means 10 is transformed into a linear light beam array by a scale 32 provided with the same pitch as the pattern 11 on the reticle 6, and these light beams illuminate the pattern 11 on the reticle 6. The light is reflected by the pattern 11, by which the pattern 11 is projected on the scale 32. Here, due to relative deviation of the reticle 6 and the reticle stage 21 (geometrical overlay), the light quantity impinging on a light receiving element 33 is modulated.

In FIG. 4, by using an output signal as produced in response from the light receiving element 33, the amount of relative deviation between the reticle 6 and the reticle stage 21 is detected. The relative deviation is measured with respect to the X and Y directions.

In this embodiment, as the reticle 6 shifts in a direction (depicted by an arrow) orthogonal to the mark (pattern) 11, the linear encoder produces a signal corresponding to the period of the pattern 11. The output signal is supplied to a phase divider 34 by which the resolution is increased. Then, in cooperation with a position counter 35 and a control device 36, the reticle stage 21 and/or the wafer stage is moved to perform the position correction. In the example shown in FIG. 2 or 3, the divider 34 operates to divide a periodic pattern of 0.5 micron into 512 elements. Thus, a resolving power of about 1 nm ($\approx$0.5 micron divided by 512) is obtained.

In FIG. 1, from an average of values measured by the encoders a and d, relative displacement in the Y direction is measured. Also, from an average of values measured by the encoders c and b, relative displacement in the X direction is measured. Further, from an average of the difference between the values measured by the encoders a and d and the difference between the values measured by the encoders c and d, relative displacement $\theta$ is calculated. There are three or more marks and linear encoders provided. The number of them, placement positions of them and directionality of them may be changed as desired, unless all of them are parallel to each other.

The linear encoder has a high resolution with respect to a direction orthogonal to the mark, but the sensitivity decreases with respect to the remaining five axes. In this connection, as shown in FIG. 1, plural encoders are used.

With the structure of this embodiment described above, relative displacement between the reticle 6 and the reticle stage 21 can be detected continuously.

In this embodiment, correction of relative displacement between the reticle and the reticle stage may be performed just before a driving signal for moving the wafer to its exposure position is applied, or it may be performed during the wafer drive. This may be selected by an operator. In a scan type projection exposure apparatus, the correction may be made during the scanning exposure.

This embodiment is particularly effective in a step-and-scan type exposure apparatus. In such an exposure apparatus, during the exposure operation, reciprocal motion of high speed and high acceleration is repeated while a reticle is being held by a reticle stage. In order to meet a required increase of throughput, the speed and acceleration of the reciprocal motion are becoming higher. As regards the reticle, on the other hand, the reticle and its position on the reticle stage are assured only by the holding performance of the reticle stage. Thus, there arises a problem with respect to shift between the reticle and the reticle stage.

Figure 7:
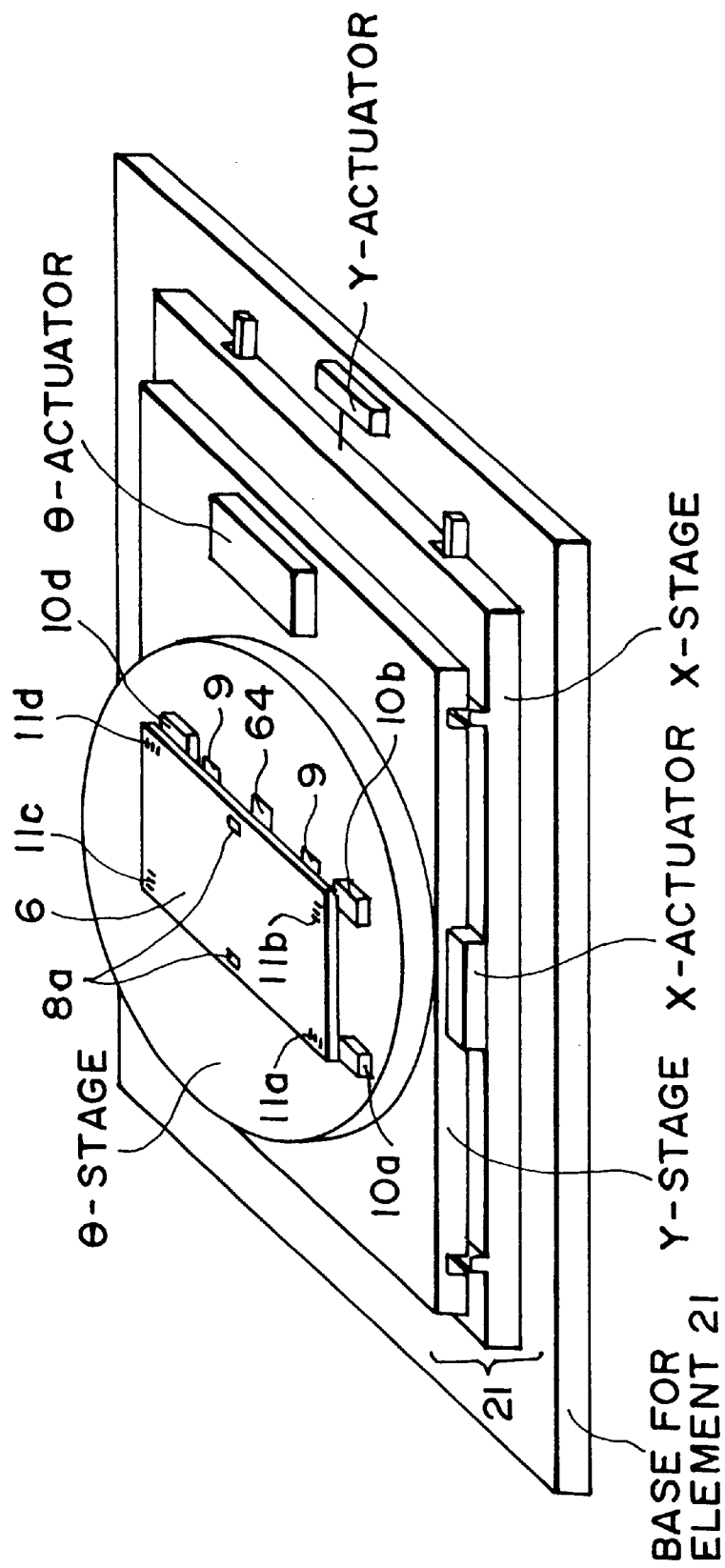
FIG. 7 is a perspective view of a main portion of an exposure apparatus according to another embodiment of the present invention.

Referring now to FIG. 7, a description will be made of a mechanism for detecting relative displacement between a reticle 6 and a reticle stage 21, in a step-and-repeat type apparatus, after the moment when positional alignment between the reticle 6 and a wafer 46 is completed.

FIG. 7 is a schematic view for explaining the structure for detecting a positional deviation of a reticle 6 placed on a reticle stage 21, by using a pattern (reticle mark) provided on the reticle 6.

In FIG. 7, there are X-, Y- and θ-drive actuators and stages related to these axes, for the reticle stage 21. The reticle stage 21 can be moved in X, Y and θ directions by means of corresponding actuators. Denoted at 6 is a reticle, and denoted at 8a is a reticle mark (reticle alignment mark) to be used for the reticle alignment. Denoted at 64 is a reticle reference mark which is provided at the base side of the reticle stage 21, for the reticle alignment. Denoted at 9 are reticle attracting pads for fixedly holding the reticle 6 on the reticle stage 21.

Denoted at 10 (10a, 10b, 10c, 10d) is detecting means which constitutes a portion of linear encoder means for detecting relative displacement between the reticle 6 and the reticle stage 21. It is provided on the reticle stage 21. Denoted at 11 (11a, 11b, 11c, 11d) are linear encoder patterns, constituting a portion of the linear encoder for detecting relative displacement of the reticle 6 and the reticle stage 21, which are provided on the reticle side.

Characters a, b, c and d denote linear encoder means (detecting means) each comprising a detecting device 10, a pattern 11 and a pattern 32, in this example. They are disposed at four corners of the reticle 6, in this embodiment.

FIG. 3 shows a portion of the pattern 11 for the linear encoder, which is provided on the reticle 6. The pattern 11 comprises a rectangular pattern having a reflective portion 11R and a non-reflective portion 11T, having a linewidth of 0.25 micron.

In FIG. 7, the reticle 6 is conveyed onto the reticle stage 21 by reticle conveying means (not shown). The reticle 6 is then set or aligned by using a reticle alignment system (not shown) and the X-, Y- and θ-actuators shown in FIG. 7, so that the deviation between the reticle alignment mark 8a and the reticle reference mark 64 is minimized. After the reticle alignment is completed, a deviation after the fixation is measured by using the reticle alignment system (not shown). The thus measured value is used as an offset in position correction.

Here, the value of a pulse counter which is a constituent element of the linear encoder (not shown), is initialized. If, thereafter, relative displacement occurs between the reticle 6 and the reticle stage 21, the amount of relative displacement is detected in real time by the linear encoder means a, b, c and d, and a corresponding signal is outputted. On the basis of a signal from the detecting means, the position of the reticle 6 and/or of the wafer 42 is corrected by using the correcting means, whereby accurate projection exposure is assured.

While, in the foregoing embodiments, a description has been made with reference to an example wherein a relative shift between a reticle and a reticle stage is detected and corrected, a similar structure may be provided with respect to the wafer side to detect and correct a relative shift between a wafer and a wafer stage.

Next, an embodiment of a semiconductor device manufacturing method which uses a projection exposure apparatus according to any one of the preceding embodiments, will be explained.

Figure 5:
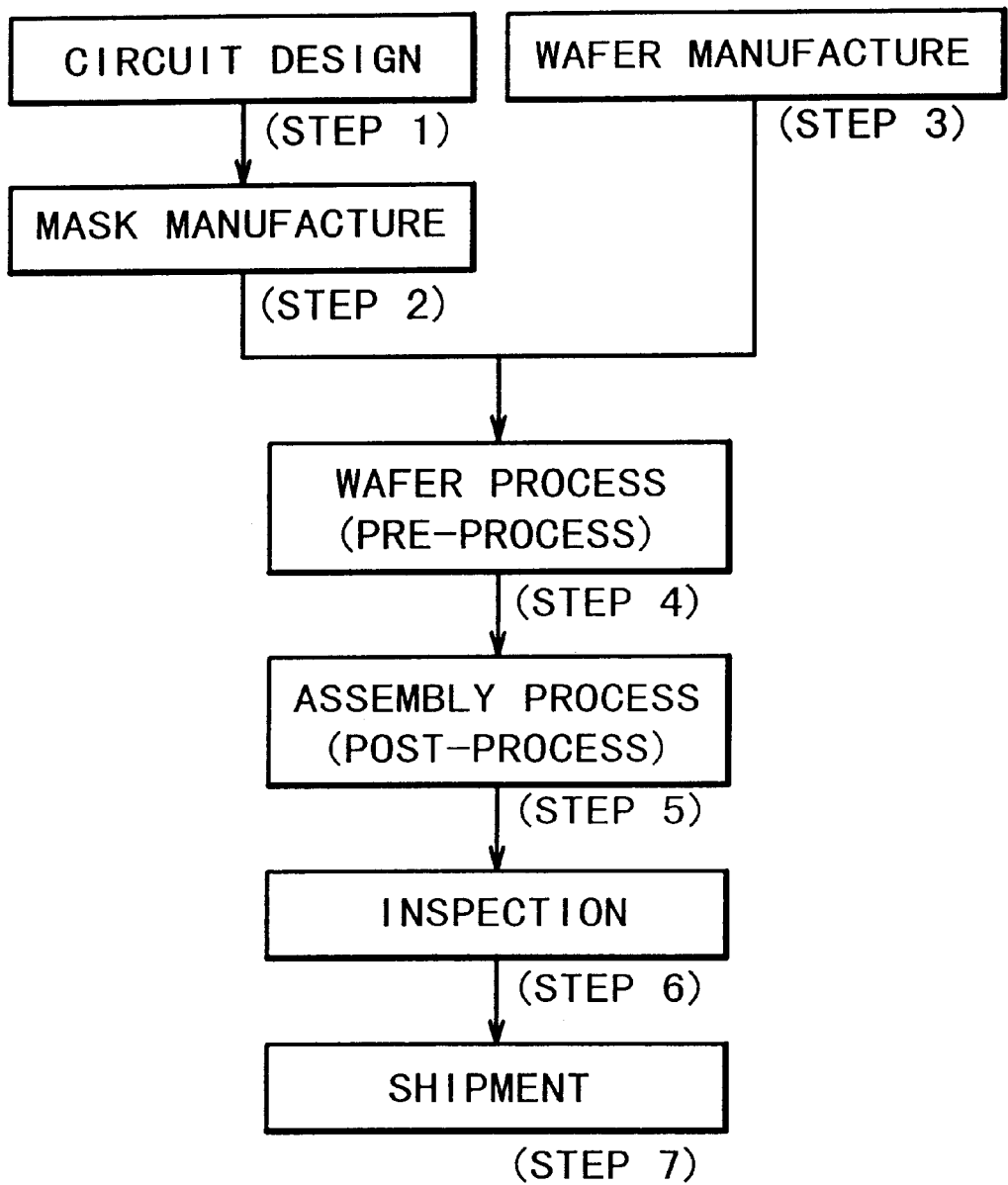
FIG. 5 is a flow chart for explaining semiconductor device manufacturing processes, according to an embodiment of the present invention.

FIG. 5 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 6:
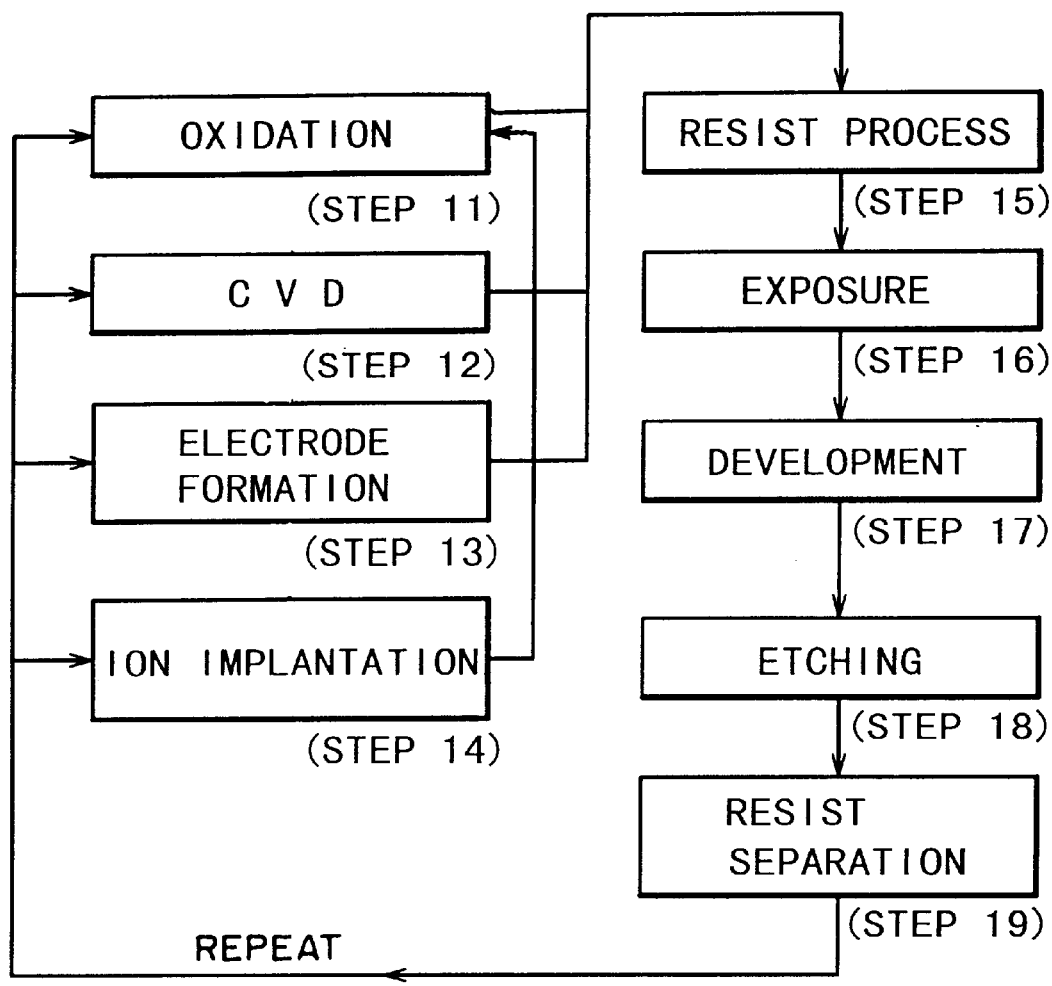
FIG. 6 is a flow chart for explaining details of a wafer process.

FIG. 6 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, a change in relative positional relationship between a reticle (first object) and a reticle stage, after completion of relative alignment between the reticle and a wafer (second object), more specifically, after completion of alignment (reticle alignment) of the reticle with respect to a reference mark provided on the major assembly of the apparatus, can be detected. Further, on the basis of the result of the detection, the position of the reticle and/or the wafer can be corrected. This provides an exposure apparatus and a device manufacturing method using the same, by which large integration semiconductor devices can be produced easily.

Moreover, positional information related to a holding stage for holding a first object with a transfer pattern, e.g., a reticle stage, can be detected in real time by using detecting means provided on the stage. This facilitates production of large integration semiconductor devices.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for transferring a pattern of a first object onto a second object after the first and second objects are aligned with each other, said apparatus comprising:
    a holding member for holding the first object, wherein the first object is positioned on said holding member and then is held thereon, and wherein the first object as held by said holding member is then aligned with respect to the second object; and
    detecting means for directly detecting a relative positional deviation between the first object and said holding member, after the first object is held by said holding member and before said holding member releases the holding of the first object.

2. An apparatus according to claim 1, wherein said detecting means detects the relative positional deviation by using a mark provided on the first object and a mark provided on said holding member.

3. An apparatus according to claim 1, wherein said detecting means is made integral with at least a portion of said holding member.

4. An apparatus according to claim 1, wherein the first object is a reticle and said holding member is a reticle stage.

5. An apparatus according to claim 1, further comprising correcting means for correcting a position of at least one of the first and second objects on the basis of the detection by said detecting means.

6. An apparatus according to claim 1, wherein said exposure apparatus is a scan type exposure apparatus.

7. An exposure apparatus for transferring a pattern of a first object onto a second object, said apparatus comprising:
    a holding member for holding the first object, wherein the first object is positioned on said holding member and then is held thereon, and wherein the first object as held by said holding member is then aligned with respect to the second object; and
    detecting means, being provided on said holding member, for directly detecting in real time a relative positional deviation between the first object and said holding member, wherein said detecting means detects the relative positional deviation after the first object is held by said holding member and before said holding member releases the holding member of the first object.

8. An apparatus according to claim 7, wherein said first stage is a stage for a reticle and said second stage is a stage for a wafer.

9. An apparatus according to claim 8, wherein said detecting means includes a light emitting element and a light receiving element, provided on said stage for the reticle, and wherein the light from said light emitting element goes via a mark provided on said stage for the reticle and a mark provided on the reticle and is received by said light receiving element.

10. An apparatus according to claim 8, further comprising correcting means for correcting a position of at least one of the first and second objects on the basis of the detection by said detecting means.

11. An apparatus according to claim 8, wherein said exposure apparatus is a scan type exposure apparatus.

12. An exposure method for transferring a pattern of a first object onto a second object after the first and second objects are aligned with each other, said method comprising the steps of:
    positioning the first object on a holding member and then holding the first object with the holding member;
    aligning the first object as held by the holding member and the second object with each other; and
    directly detecting a relative positional deviation between the first object and the holding member, after the first object is held by the holding member and before the holding member releases the holding of the first object.

13. A method according to claim 12, further comprising correcting a position of at least one of the first and second objects, on the basis of the detection in said detection step.

14. A method according to claim 13, wherein the correction in said correcting step is made before the pattern of the first object is transferred onto a subsequent region on the second object.

15. A method according to claim 13, wherein the correction in said correcting step is made during transfer of the pattern of the first object onto the second object.

16. A method according to claim 13, wherein the correction in said correcting step is made just before or during movement of the second object toward a position where the pattern of first object is transferred to the second object.

17. A method according to claim 13, wherein the correction in said correcting step is performed in a selected one of plural modes of operation.

18. A device manufacturing method, comprising the steps of:
    positioning a first object on a holding member;
    aligning the first object and a second object with each other;
    directly detecting a relative positional deviation between the first object and the holding member, after the first object is held by the holding member and before the holding member releases the holding of the first object;
    correcting the position of at least one of the first and second objects, on the basis of the detection made in said detecting step;
    transferring the pattern of the first object onto the second object after the objects are aligned with each other; and
    processing the second object having the pattern transferred thereto, for production of a device.

19. A device manufacturing method, comprising the steps of:
    positioning a first object on a holding member and then holding the first object with the holding member;
    aligning the first object as held by the holding member and a second object with each other;
    directly detecting a relative positional deviation between the first object and the holding member, after the first object is held by the holding member and before the holding member releases the holding of the first object;
    correcting the position of at least one of the first and second objects, on the basis of the detection made in said detecting step;

transferring the pattern of the first object onto the second object after the objects are aligned with each other; and processing the second object having the pattern transferred thereto, for production of a device.

20. An exposure apparatus for transferring a pattern of a first object onto a second object, said apparatus comprising:

a holding member for holding the first object thereon, at a predetermined position;

a positioning member for positioning the first object on said holding member;

a detecting member for directly detecting a relative positional deviation between the first object and said holding member, after the first object is held by said holding member and before said holding member releases the holding of the first object; and a correcting member for correcting the position of at least one of the first and second objects, on the basis of the relative positional deviation detected by said detecting member.

21. A device manufacturing method comprising the steps of:

positioning a first object upon a holding member;

holding the first object by the holding member;

directly detecting a relative positional deviation between the first object and the holding member, after the first object is held by the holding member and before the holding member releases the holding of the first object;

correcting the position of at least one of the first object and a second object on the basis of the detected relative positional deviation;

aligning the first and second objects with each other after the correction;

transferring a pattern of the first object onto the second object, after the first and second objects are aligned with each other; and processing the second object having the pattern transferred thereto, for production of a device.

* * * * *

UNITED STATES PATENT AND TRADEMARK OFFICE
CERTIFICATE OF CORRECTION

PATENT NO. : 6,714,691 B2
DATED : March 30, 2004
INVENTOR(S) : Kazuhito Outsuka

It is certified that error appears in the above-identified patent and that said Letters Patent is hereby corrected as shown below:

Column 3,
Line 9, "This optical square is monitored by a laser" should be deleted.
Line 10, "interferometer 47." should be deleted.

Column 4,
Line 60, "Y the" should read -- Y, the --.

Column 5,
Line 58, "pattern 32," should read -- pattern 32 (see FIG. 4), --.

Column 8,
Line 27, "so prepared" should read --so-prepared --.

Signed and Sealed this

Twenty-seventh Day of July, 2004

JON W. DUDAS
*Acting Director of the United States Patent and Trademark Office*